(12) United States Patent
Raschke et al.

(10) Patent No.: US 12,253,798 B2
(45) Date of Patent: Mar. 18, 2025

(54) RETICLE CONTAINER HAVING ROTATING CONNECTOR WITH SPRING FORCE LATCHING

(71) Applicant: ENTEGRIS, INC., Billerica, MA (US)

(72) Inventors: Russ V. Raschke, Chanhassen, MN (US); Brian Wiseman, Glencoe, MN (US); Matthew Reber, Chaska, MN (US)

(73) Assignee: ENTEGRIS, INC., Billerica, MA (US)

( * ) Notice: Subject to any disclaimer, the term of this patent is extended or adjusted under 35 U.S.C. 154(b) by 4 days.

(21) Appl. No.: 18/132,718

(22) Filed: Apr. 10, 2023

(65) Prior Publication Data
US 2023/0333464 A1    Oct. 19, 2023

Related U.S. Application Data

(60) Provisional application No. 63/332,678, filed on Apr. 19, 2022.

(51) Int. Cl.
*G03F 1/66* (2012.01)
*B65D 45/24* (2006.01)

(52) U.S. Cl.
CPC ............ *G03F 1/66* (2013.01); *B65D 45/24* (2013.01)

(58) Field of Classification Search
CPC .............. G03F 1/66; H01L 21/67359; H01L 21/67353; H01L 21/67369; H01L 21/67386; B65D 45/24

USPC .................................. 206/454, 710
See application file for complete search history.

(56) References Cited

U.S. PATENT DOCUMENTS

| | | | |
|---|---|---|---|
| 9,064,917 B2 * | 6/2015 | Ku ................. | H01L 21/67373 |
| 9,761,470 B2 * | 9/2017 | Abe ................. | H01L 21/67373 |
| 2002/0063080 A1 | 5/2002 | Lewis et al. | |
| 2006/0000747 A1 * | 1/2006 | Wright ............ | H01L 21/67353 |
| | | | 206/454 |
| 2013/0020220 A1 | 1/2013 | Kolbow et al. | |
| 2013/0248399 A1 * | 9/2013 | Lin .................. | B65D 45/16 |
| | | | 206/454 |
| 2014/0076774 A1 | 3/2014 | Kaashoek | |
| 2014/0291198 A1 | 10/2014 | Lu et al. | |
| 2017/0372931 A1 | 12/2017 | Kirkland | |
| 2020/0335371 A1 * | 10/2020 | Chuang .......... | H01L 21/67376 |
| 2021/0116821 A1 * | 4/2021 | Chuang .......... | H01L 21/67359 |

* cited by examiner

*Primary Examiner* — Steven A. Reynolds

(57) ABSTRACT

Reticle containers include a rotating latch including a spring. The spring provides force bringing the segments of the reticle container towards one another such that a reticle in the container is clamped between the container segments. The rotating latch can include a head as part of an assembly on one of a cover or a baseplate of the reticle container, with a slot configured to accommodate the head provided on the other of the cover or baseplate. The head can be disposed at an end of a shaft, with the shaft connected to a base, which is contacted by spring providing force such that the contact of the head with the other of the cover or baseplate provides clamping force to a reticle stored between the cover and baseplate.

11 Claims, 3 Drawing Sheets

RETICLE CONTAINER HAVING ROTATING CONNECTOR WITH SPRING FORCE LATCHING

FIELD

This disclosure is directed to a container for storage and/or transportation of a reticle, particularly one including a rotating connector using spring force to retain the closure of the connector.

BACKGROUND

Reticles typically are transported, processed, and stored in reticle containers which include an inner pod and an outer pod. The inner pod is configured such that it can be used during the processing of the reticles, for example in photolithography such as extreme ultraviolet (EUV) processes. The features of inner pods making them suitable for use in reticle processing such as filters, formation of seals, and/or other features of the inner pods can make the inner pods more complex and expensive, and less suitable for storage of reticles.

SUMMARY

This disclosure is directed to a container for storage and/or transportation of a reticle, particularly one including a rotating connector using spring force to retain the closure of the connector.

Reticle containers can be secured by rotating latches. The rotating latches can be driven by spring force to pull the segments of the reticle container towards one another to clamp a reticle located within the container. By using spring force at latches of the container to provide the force clamping the reticle within the container, reticles of varying thickness can be secured within the container. The rotating latches can secure the reticle container with reduced particle generation or keep any generated particles away from the reticle stored within. Further, the rotating latches can be automatically actuated, allowing the reticle to be secured within the reticle or the reticle container opened without requiring human interaction.

In an embodiment, a reticle container includes a first container segment and a second container segment. The first container segment and the second container segment define an internal space configured to accommodate a reticle. The first container segment includes an aperture extending through first container segment, and a retention recess intersecting the aperture on a side of the first container segment configured to face away from the second container segment when the reticle container is assembled. The second container segment includes a rotatable latch, the rotatable latch including a latch base, a shaft, and a head. The head is configured to pass through the aperture when in a first orientation and to engage with the retention recess when in a second orientation. The rotatable latch is configured to be rotated between the first orientation and the second orientation.

In an embodiment, the reticle container further includes a spring configured to contact the second container segment and the rotatable latch, wherein the spring drives the rotatable latch such that the head is driven towards the second container segment.

In an embodiment, the latch base includes an actuation feature.

In an embodiment, the retention recess includes a ramped surface.

In an embodiment, the shaft includes a retention ring groove and the rotatable latch includes a retention ring, a portion of the retention ring being accommodated in the retention ring groove. In an embodiment, one or more retention projections extend outwards from the shaft. In an embodiment, the one or more retention projections are portions of a retention pin, the retention pin retained within a channel formed in the slot.

In an embodiment, the aperture is a slot. In an embodiment, the head includes two opposing projections.

In an embodiment, a method of closing a reticle container includes passing a head of a rotatable latch through an aperture provided on a first container segment and rotating the rotatable latch such that the head engages a retention recess intersecting the aperture.

In an embodiment, rotating the rotatable latch includes engaging an actuation feature provided on a base of the rotatable latch with an actuator, and the actuator rotating the rotatable latch through the engagement with the actuating feature.

In an embodiment, the rotatable latch is included in a second container segment, and a reticle is located between the first container segment and the second container segment.

In an embodiment, a spring contacting the rotatable latch applies force driving engagement of the head with the retention recess.

In an embodiment, a retention ring is provided in a retention ring groove formed in a shaft of the rotatable latch.

In an embodiment, the aperture is a slot.

In an embodiment, the head includes two opposing projections.

DRAWINGS

DETAILED DESCRIPTION

This disclosure is directed to a container for storage and/or transportation of a reticle, particularly one including a rotating connector using spring force to retain the closure of the connector.

Figure 1:
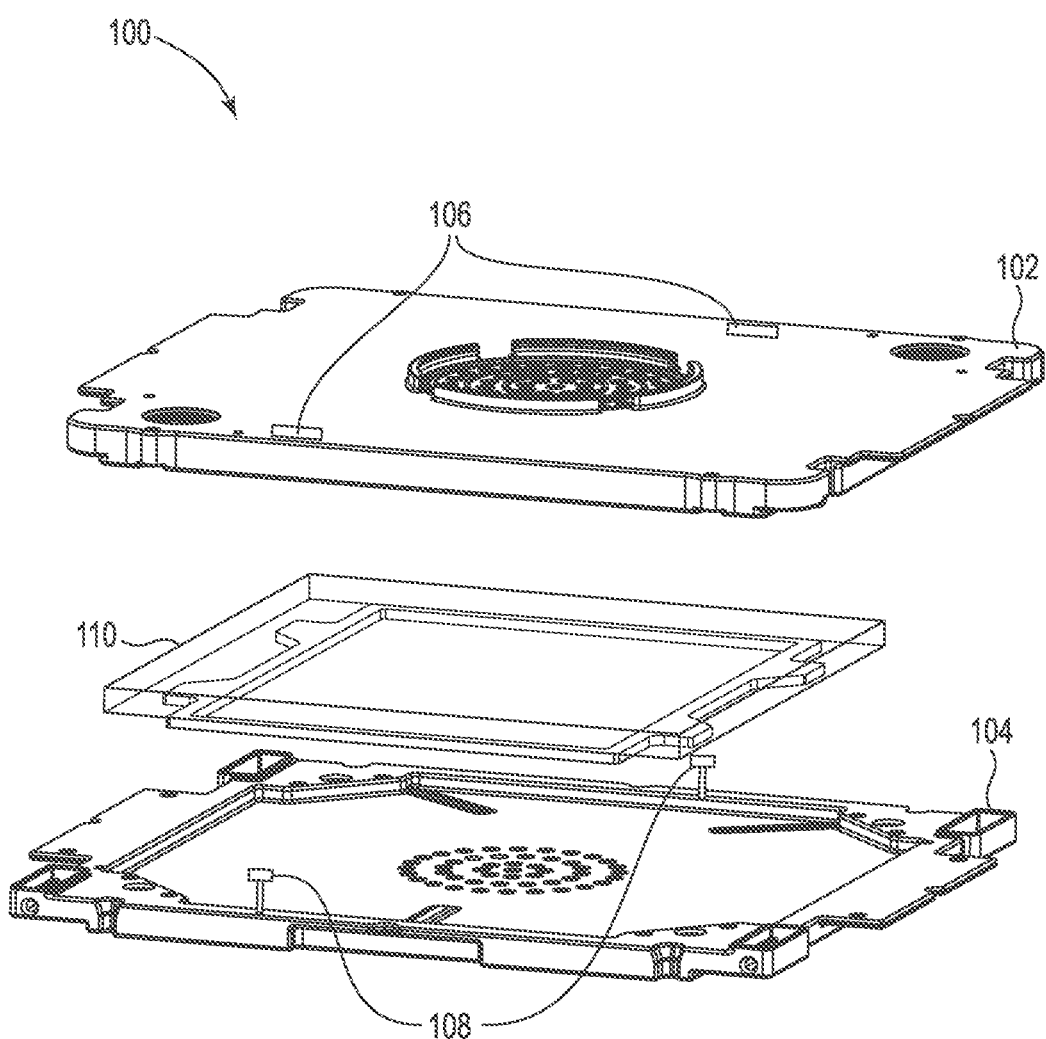
FIG. 1 shows an exploded view of a reticle container and reticle according to an embodiment.

FIG. 1 shows an exploded view of a reticle container and reticle according to an embodiment. Reticle container 100 includes cover 102 and baseplate 104. Cover 102 includes cover latching feature 106. Baseplate 104 includes baseplate latching feature 108. Reticle 110 can be contained within the reticle container 100 between cover 102 and baseplate 104.

Reticle container 100 is a container configured to accommodate a reticle 110, such as a reticle for processing such as photolithography, for example extreme ultraviolet (EUV) processing. The reticle container 100 can be used to transport and/or store the reticle 110. In an embodiment, the reticle container 100 is an EUV reticle container. In an embodiment, the reticle container 100 is a stocker pod for storage of reticle 110 prior to, during, or after processing. In an embodiment, the reticle container 100 can be received at a load port of an EUV processing device to be opened and for the reticle 110 to be added to or removed from the reticle container 100. The reticle container 100 contains the reticle 110 in an internal space within the reticle container 100. In an embodiment, the reticle container 100 clamps reticle 110 to secure the reticle 110 in a particular position. In an embodiment, the reticle container 100 forms a seal around its perimeter when reticle 110 is contained within reticle container 100. In an embodiment, the reticle container 100 does not form a seal and includes a gap in at least some areas of the perimeter when reticle 110 is contained within reticle container 100.

Figure 2:
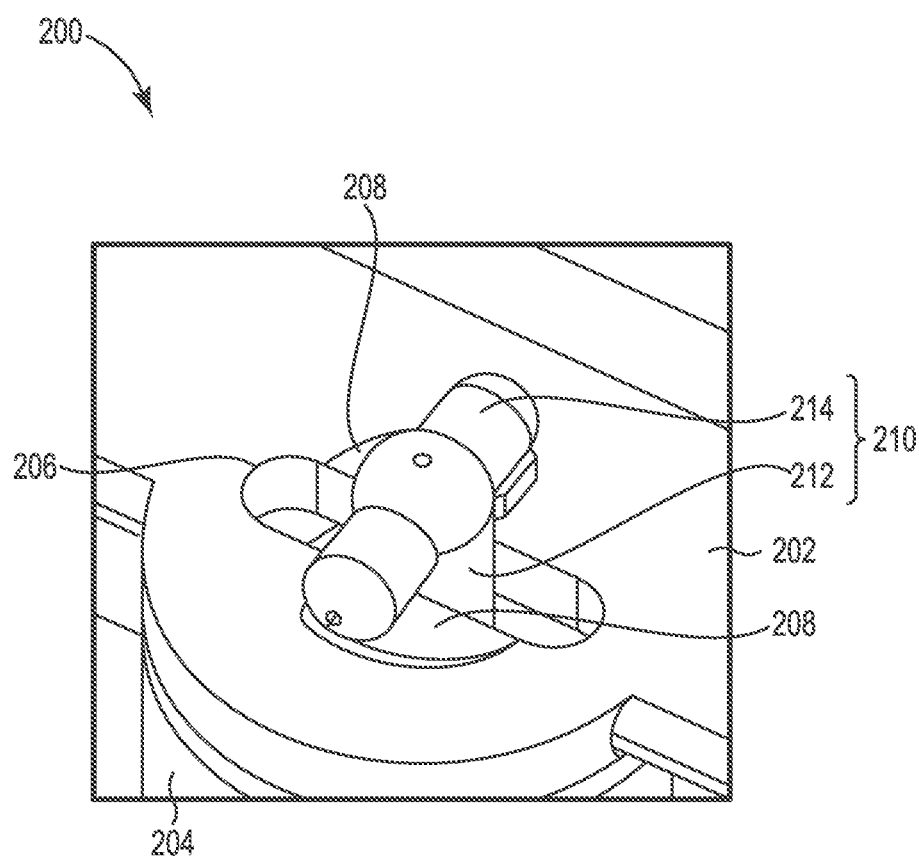
FIG. 2 shows a perspective view of a reticle container at a closure according to an embodiment.

Cover 102 forms a first container segment of the reticle container 100. The cover 102 forms part of an internal space configured to accommodate the reticle 110. The cover 102 includes one or more of a cover latching feature 106. The cover latching feature 106 forms part of a latch configured to secure cover 102 to baseplate 104. In an embodiment, the cover latching feature 106 can include a slot and a retention region, for example, slot 206 and retention region 208 as shown in FIG. 2 and discussed below. In an embodiment, the cover latching feature 106 can include a latch mechanism with a protruding shaft and head, such as latch mechanism 210, shaft 212, and head 214 as shown in FIG. 2 and discussed below. The latching securing cover 102 to baseplate 104 can clamp reticle 110 between the cover 102 and baseplate 104. In an embodiment, the latching can be such that cover 102 and baseplate 104 to not form a seal with one another, with the perimeter of cover 102 and baseplate 104 being spaced apart from one another.

A baseplate 104 forms a second container segment of the reticle container 100. The baseplate 104, when combined with cover 102 forms the internal space capable of accommodating reticle 110. The baseplate 104 includes one or more of a baseplate latching feature 108. The baseplate latching feature 108 is configured to interface with a cover latching feature 106 to form a latch configured to at least partially secure cover 102 to baseplate 104. In an embodiment, the baseplate latching feature 108 can include a slot and a retention region, for example, slot 206 and retention region 208 as shown in FIG. 2 and discussed below. In an embodiment, the baseplate latching feature 108 can include a latch mechanism with a protruding shaft and head, such as latch mechanism 210, shaft 212, and head 214 as shown in FIG. 2 and discussed below.

FIG. 2 shows a perspective view of a reticle container at a closure according to an embodiment. Reticle container 200 includes cover 202 and baseplate 204. Cover 202 includes slot 206 and retention region 208 intersecting with or surrounding the slot 206. Baseplate 204 includes latch mechanism 210, including shaft 212 and head 214 projecting from the baseplate 204 towards the cover 202.

Cover 202 forms a portion of reticle container 200. When combined with baseplate 204, the cover 202 defines a space configured to contain a reticle, such as reticle 110 as discussed above and shown in FIG. 1. The cover 202 includes slot 206 and retention region 208. The slot 206 is an opening passing through a thickness of cover 202. Slot 206 is configured to allow head 214 to pass through the slot when head 214 is aligned with slot 206, and to prevent head 214 from passing through the slot 206 when the head 214 is not aligned with slot 206. Slot 206 can have any suitable shape for selectively allowing passage of head 214 based on alignment, for example an oblong shape, a cross shape, a rectangular shape, or the like. The slot 206 can be disposed such that it opposes latch mechanism 210 when cover 202 and baseplate 204 are joined. The slot 206 can be disposed in a perimeter region of the cover 202, such that the interface of slot 206 with latch mechanism 210 is outside the region of reticle container 200 configured to accommodate the reticle. The cover 202 can include additional slots 206, for example including a slot 206 for each of the latch mechanisms provided on baseplate 204. Retention region 208 can intersect with or surround the slot 206. The retention region 208 is on a side of cover 202 facing away from baseplate 204 when the reticle container 200 is assembled. The retention region 208 can include a depression configured to receive the head 214 when the head 214 and a portion of shaft 212 have been passed through the slot 206 and rotated such that the head 214 does not align with slot 206. The retention region 208 can include a ramped portion configured to restrict rotation of the head 214 such that the head 214 cannot work its way into alignment with slot 206 unless expressly manipulated to produce such alignment.

Baseplate 204 forms another portion of reticle container 200. Baseplate 204 is configured to, when joined with cover 202, define an internal space capable of accommodating a reticle. In the embodiment shown in FIG. 2, baseplate 204 includes latch mechanism 210. The latch mechanism 210 provides a shaft 212 extending outwards from baseplate 204 on a side of baseplate 204 configured to face cover 202 when the reticle container 200 is assembled. Head 214 is disposed at an end of shaft 212. Head 214 is configured to be capable of passing through slot 206 when in a first orientation, and unable to pass through slot 206 when in other orientations. Head 214 can be configured such that it can be retained by contact with the retention region 208 such that the head 214 in a position where it is unable to pass through slot 206. Head 214 can have any suitable shape, such as, for example an oblong shape, a cross shape, a rectangular shape, or the like depending on the shape of slot 206.

While the embodiment shown in FIG. 2 provides slot 206 and retention region 208 on cover 202, and latch mechanism 210 on baseplate 204, in embodiments the slot 206 and retention region 208 can instead be disposed on baseplate 204, and latch mechanism 210 can be disposed on cover 202. In such an embodiment, slot 206 extends through the baseplate 204, and retention region is on a side of baseplate 204 opposite the side facing cover 202 when the reticle container 200 is assembled. Also in such an embodiment, the shaft 212 and head 214 extend outwards from the cover 202 on a side of cover 202 that faces baseplate 204 when reticle container 200 is assembled.

Figure 3:
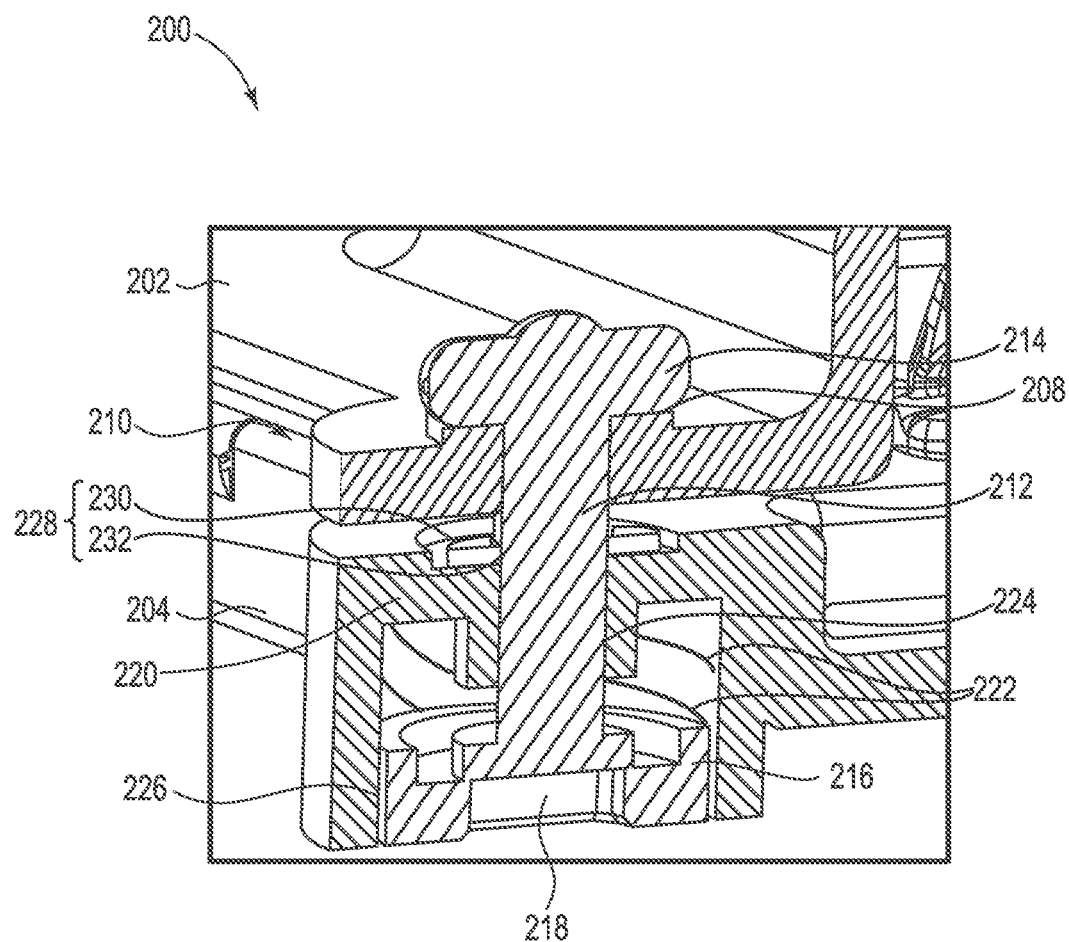
FIG. 3 shows a sectional view of a reticle container at a closure according to an embodiment.

FIG. 3 shows a sectional view of a reticle container at a closure according to the embodiment shown in FIG. 2. As can be seen in FIG. 3, latch mechanism 210 includes a base 216. Base 216 includes an actuation feature 218. Latch mechanism 210 includes a latch retention body 220. A spring 222 is positioned within the latch retention body 220 and contacts the base 216.

Base 216 is joined to shaft 212. Base 216 includes an actuation feature 218. The actuation feature 218 can be any suitable feature allowing base 216 to be engaged with and rotated by a user or automation system. In the embodiment shown in FIG. 3, the actuation feature is a recess formed in the side of base 216 facing outwards from latch mechanism 216. In embodiments, the actuation feature 218 can be a projection. The actuation feature 218 can have any suitable shape capable of allowing the base 216 to be rotated about the axis of shaft 212 by engagement with the actuation feature. Non-limiting examples of the shape for the actuation feature can be a projection or a recess having a cross-sectional profile that is oblong, star-shaped, square, or the like.

The latch retention body 220 is a portion of the cover or baseplate of the reticle container configured to contain the base 216 and a portion of shaft 212 such that the base 216 can be rotated about the axis of shaft 212. The latch retention body 220 includes an aperture 224 and bore 226. The base 216 can be moved within a bore 226 in an axial direction. Aperture 224 allows shaft 212 to extend from the latch retention body 220. A spring 222 can be contained within bore 226. Spring 222 is configured to contact base 216 on a side opposite actuation feature 218. The spring can also contact latch retention body 220 at a region where the latch retention body 220 surrounds aperture 224. The spring provides spring force driving the base 216 away from the aperture 224. The force applied by spring 220 can drive the base 216 such that when the head 214 is engaged with the retention region 208, the cover 202 and baseplate 204 are driven towards one another, and can thus clamp a reticle within the reticle container 200.

In an embodiment, the base 216 is joined to shaft 212 by way of a mechanical connection, such as threading of the shaft 212 into an opening provided in base 216 or any other suitable mechanical connection such as the interfacing of connection features, snap fitting using suitable features, press fitting, or the like. In an embodiment, the shaft 212 is formed integrally with the base 216. In an embodiment where the shaft is formed integrally with the base 216, the shaft 212 and the head 214 can be mechanically joined, for example after passing shaft 212 through aperture 224 of the latch retention body 220. In an embodiment, base, 216, shaft 212, and head 214 can all be formed as one part. In this embodiment, aperture 224 can be shaped so that head 214 can pass through the aperture 224 when in a particular orientation. The aperture 224 can be positioned such that it is not aligned with slot 206.

In an embodiment, retention can be provided along the shaft 212 such that it cannot be passed through aperture 224 past a certain point. In an embodiment, the retention feature 228 can include a retention ring 230 and a retention groove 232 configured to accommodate the retention ring 230. In other embodiments, the retention feature 228 can alternatively include a pin passed through an aperture, or any other suitable feature providing mechanical interference between the shaft 212 and aperture 224. In an embodiment, the retention feature 228 can be formed integrally in shaft 212. In an embodiment, the retention feature 228 can include one or more additional parts such as the retention ring 230, the pin discussed above, or any other suitable additional parts. The additional parts can be joined to shaft 212, for example by a mechanical connection such as a snap fit or a press fit, or the like.

Aspects:

It is understood that any of aspects 1-9 can be combined with any of aspects 10-16.

Aspect 1. A reticle container, comprising
a first container segment; and
a second container segment;
wherein the first container segment and the second container segment define an internal space configured to accommodate a reticle,
the first container segment includes an aperture extending through first container segment, and a retention recess intersecting the aperture on a side of the first container segment configured to face away from the second container segment when the reticle container is assembled, the second container segment including a rotatable latch, the rotatable latch including a latch base, a shaft, and a head, wherein the head is configured to pass through the aperture when in a first orientation and to engage with the retention recess when in a second orientation, the rotatable latch configured to be rotated between the first orientation and the second orientation.

Aspect 2. The reticle container according to aspect 1, further comprising a spring configured to contact the second container segment and the rotatable latch, wherein the spring drives the rotatable latch such that the head is driven towards the second container segment.

Aspect 3. The reticle container according to any of aspects 1-2, wherein the latch base includes an actuation feature.

Aspect 4. The reticle container according to any of aspects 1-2, wherein the retention recess includes a ramped surface.

Aspect 5. The reticle container according to any of aspects 1-4, wherein the shaft includes a retention ring groove and the rotatable latch includes a retention ring, a portion of the retention ring being accommodated in the retention ring groove.

Aspect 6. The reticle container according to any of aspects 1-5, wherein one or more retention projections extend outwards from the shaft.

Aspect 7. The reticle container according to aspect 6, wherein the one or more retention projections are portions of a retention pin, the retention pin retained within a channel formed in the slot.

Aspect 8. The reticle container according to any of aspects 1-7, wherein the aperture is a slot.

Aspect 9. The reticle container according to aspect 8, wherein the head includes two opposing projections.

Aspect 10. A method of closing a reticle container, comprising passing a head of a rotatable latch through an aperture provided on a first container segment and rotating the rotatable latch such that the head engages a retention recess intersecting the aperture.

Aspect 11. The method according to aspect 10, wherein rotating the rotatable latch includes engaging an actuation feature provided on a base of the rotatable latch with an actuator, and the actuator rotating the rotatable latch through the engagement with the actuating feature.

Aspect 12. The method according to any of aspects 10-11, wherein the rotatable latch is included in a second container segment, and a reticle is located between the first container segment and the second container segment.

Aspect 13. The method according to any of aspects 10-12, wherein a spring contacting the rotatable latch applies force driving engagement of the head with the retention recess.

Aspect 14. The method according to any of aspects 10-13, wherein a retention ring is provided in a retention ring groove formed in a shaft of the rotatable latch.

Aspect 15. The method according to any of aspects 10-14 wherein the aperture is a slot.

Aspect 16. The method according to any of aspects 10-15, wherein the head includes two opposing projections.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:
1. A reticle container, comprising
a first container segment; and
a second container segment;
wherein the first container segment and the second container segment define an internal space configured to accommodate a reticle, the first container segment includes an aperture extending through the first container segment, and a retention recess intersecting the aperture on a side of the first container segment configured to face away from the second container segment when the reticle container is assembled, the second container segment including a rotatable latch, the rotatable latch including a latch base, a shaft, and a head, wherein the head is configured to pass through the aperture when in a first orientation and to engage with the retention recess when in a second orientation, the rotatable latch configured to be rotated between the first orientation and the second orientation, wherein the shaft includes a retention ring groove and the rotatable latch includes a retention ring, a portion of the retention ring being accommodated in the retention ring groove.

2. The reticle container of claim 1, further comprising a spring configured to contact the second container segment and the rotatable latch, wherein the spring drives the rotatable latch such that the head is driven towards the second container segment.

3. The reticle container of claim 1, wherein the latch base includes an actuation feature.

4. The reticle container of claim 1, wherein the retention recess includes a ramped surface.

5. The reticle container of claim 1, wherein one or more retention projections extend outwards from the shaft.

6. The reticle container of claim 1, wherein the aperture is a slot.

7. The reticle container of claim 6, wherein the head includes two opposing projections.

8. A reticle container, comprising
a first container segment;
a second container segment; and
further comprising a spring configured to contact the second container segment, wherein the first container segment and the second container segment define an internal space configured to accommodate a reticle, the first container segment includes an aperture extending through the first container segment, and a retention recess intersecting the aperture on a side of the first container segment configured to face away from the second container segment when the reticle container is assembled, the second container segment including a rotatable latch, the rotatable latch including a latch base, a shaft, and a head, wherein the head is configured to pass through the aperture when in a first orientation and to engage with the retention recess when in a second orientation, the rotatable latch configured to be rotated between the first orientation and the second orientation, wherein the spring is configured to contact the rotatable latch, and wherein the spring drives the rotatable latch such that the head is driven towards the second container segment.

9. The reticle container of claim 8, wherein the shaft includes a retention ring groove and the rotatable latch includes a retention ring, a portion of the retention ring being accommodated in the retention ring groove.

10. The reticle container of claim 8, wherein the latch base includes an actuation feature.

11. The reticle container of claim 8, wherein the retention recess includes a ramped surface.

* * * * *